(12) United States Patent
Brown et al.

(10) Patent No.: US 8,772,729 B1
(45) Date of Patent: Jul. 8, 2014

(54) APDS USING NANO-PLASMONIC METAMATERIALS

(75) Inventors: Robert G. Brown, Tustin, CA (US); James H. Stanley, Palo Alto, CA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 150 days.

(21) Appl. No.: 13/360,570

(22) Filed: Jan. 27, 2012

Related U.S. Application Data

(63) Continuation-in-part of application No. 13/243,342, filed on Sep. 23, 2011.

(51) Int. Cl.
*G01T 1/02* (2006.01)
*H01L 31/0352* (2006.01)
*H01L 31/0232* (2014.01)
*B82Y 20/00* (2011.01)

(52) U.S. Cl.
CPC .. H01L 31/035218 (2013.01); H01L 31/02327 (2013.01); B82Y 20/00 (2013.01)
USPC .................................................. 250/370.07

(58) Field of Classification Search
CPC .......................... H01L 31/02327; B82Y 20/00
USPC ...................... 257/20–22, 186, 428, E31.003; 250/370.07
See application file for complete search history.

(56) References Cited

U.S. PATENT DOCUMENTS

| | | | |
|---|---|---|---|
| 4,814,847 A * | 3/1989 | Tabatabaie | 257/186 |
| 4,814,874 A | 3/1989 | Adachi | |
| 5,949,071 A | 9/1999 | Ruffner et al. | |
| 8,089,115 B2 | 1/2012 | Leong et al. | |
| 2007/0289623 A1 | 12/2007 | Atwater | |
| 2010/0058978 A1 | 3/2010 | Nikoobakht | |
| 2010/0124053 A1 | 5/2010 | Wu et al. | |
| 2010/0127172 A1 | 5/2010 | Nikoobakht | |
| 2011/0215298 A1 | 9/2011 | Kim et al. | |
| 2011/0278541 A1 * | 11/2011 | Huang et al. | 257/21 |
| 2012/0280209 A1 | 11/2012 | Bonnell et al. | |

FOREIGN PATENT DOCUMENTS

| | | |
|---|---|---|
| RU | 2374720 C1 | 11/2009 |
| RU | 101866 U1 | 1/2011 |
| WO | WO-2008/135905 | 11/2008 |
| WO | WO-2009/104188 | 8/2009 |

OTHER PUBLICATIONS

U.S. Appl. No. 13/243,342, filed Sep. 23, 2011, Brown et al.

(Continued)

*Primary Examiner* — Thomas L Dickey
(74) *Attorney, Agent, or Firm* — Donna P. Suchy; Daniel M. Barbieri

(57) ABSTRACT

An avalanche photodiode (APD) electro-magnetic radiation (EMR) detector is described. The detector includes an EMR absorption region, a voltage biasing element, and a charge multiplication region. The EMR absorption region includes a substantially regular array of nano-particles embedded in a matrix material. The voltage biasing element is configured to apply a bias voltage to the matrix material such that electrical current is directly generated in the EMR absorption region based on a cooperative plasmon effect in the detector material when electro-magnetic radiation in a predetermined wavelength range is incident upon the detector material, where the dominant mechanism for decay in the cooperative plasmon effect is non-radiative. The charge multiplication region is arranged relative to the EMR absorption region to avalanche multiply the electrical current generated in the EMR absorption region.

22 Claims, 18 Drawing Sheets

(56) References Cited

OTHER PUBLICATIONS

Campbell, J.C.—in Lin, C., Optoelectronic Technology and Lightwave Communication Systems, Van Nostrand Reinhold, 1989, Chapter 14, 40 pages.
Knight, M.W., et al., Photodetection with active optical antennas, Science, vol. 332, May 6, 2011, 5 pages.
McIntyre, R.J., Recent developments in silicon avalanche photodiodes, Measurement, vol. 3, 1985, pp. 146-152.
Rogalski, A. (Editor), Selected Papers on Infrared Detectors: Developments, SPIE Milestone Series, vol. MS 179, SPIE Press, Bellingham, Washington, 2004.
U.S. Appl. No. 13/243,443, filed Sep. 23, 2011, Brown et al.
Anderson, Surface Enhanced Infrared Absorption by Coupling Photon and Plasmon Resonance, Applied Physics Letters, 2005, 4 pages.
McIntyre, The Distribution of Gains in Uniformly Multiplying Avalanche Photodiodes: Theory, IEEE Transactions on Electron Devices, Jun. 1972, 11 pages.
Miyachi et al., A Photosensing System Composed of Photosystem I, Molecular Wire, Gold Nano-Particle, and Double Surfactants in Water, 2010, 3 pages.
Radford et al., Sensitivity Improvements in Uncooled Microbolometer FPAs, 1999, 12 pages.
Saleh et al., Fundamentals of Photonics, 1991, 4 pages.
Sonnichsen et al., Drastic Reduction of Plasmon Damping in Gold Nanorods, 2002, 4 pages.
Wokaun, Surface Enhancements of Optical Fields, 1985, 34 pages.
Yamaguchi et al., Optical Effect of the Substrate on the Anomalous Absorption of Aggregated Silver Films, 1974, 15 pages.
Zayats et al., Nano-Optics of Surface Plasmon Polaritons, 2005, 184 pages.
Zhao et al., The Extinction Spectra of Silver Nanoparticle Arrays: Influence of Array Structure on Plasmon Resonance Wavelength and Width, 2003, 8 pages.
International Search Report and Written Opinion for Application No. PCT/US2012/035112, mail date Jun. 28, 2012, 5 pages.
Office Action for U.S. Appl. No. 13/243,342, mail date Sep. 19, 2013, 8 pages.
Office Action on U.S. Appl. No. 13/690,276 Dated Mar. 7, 2014, 11 pages.
Novotny, "The History of Near-field Optics", from Progress in Optics 50, chapter 5, p. 137- 184 (Elsevier, Amsterdam, The Netherlands, 2007).
Office Action on U.S. Appl. No. 13/690,276 Dated Apr. 10, 2014, 16 pages.

\* cited by examiner

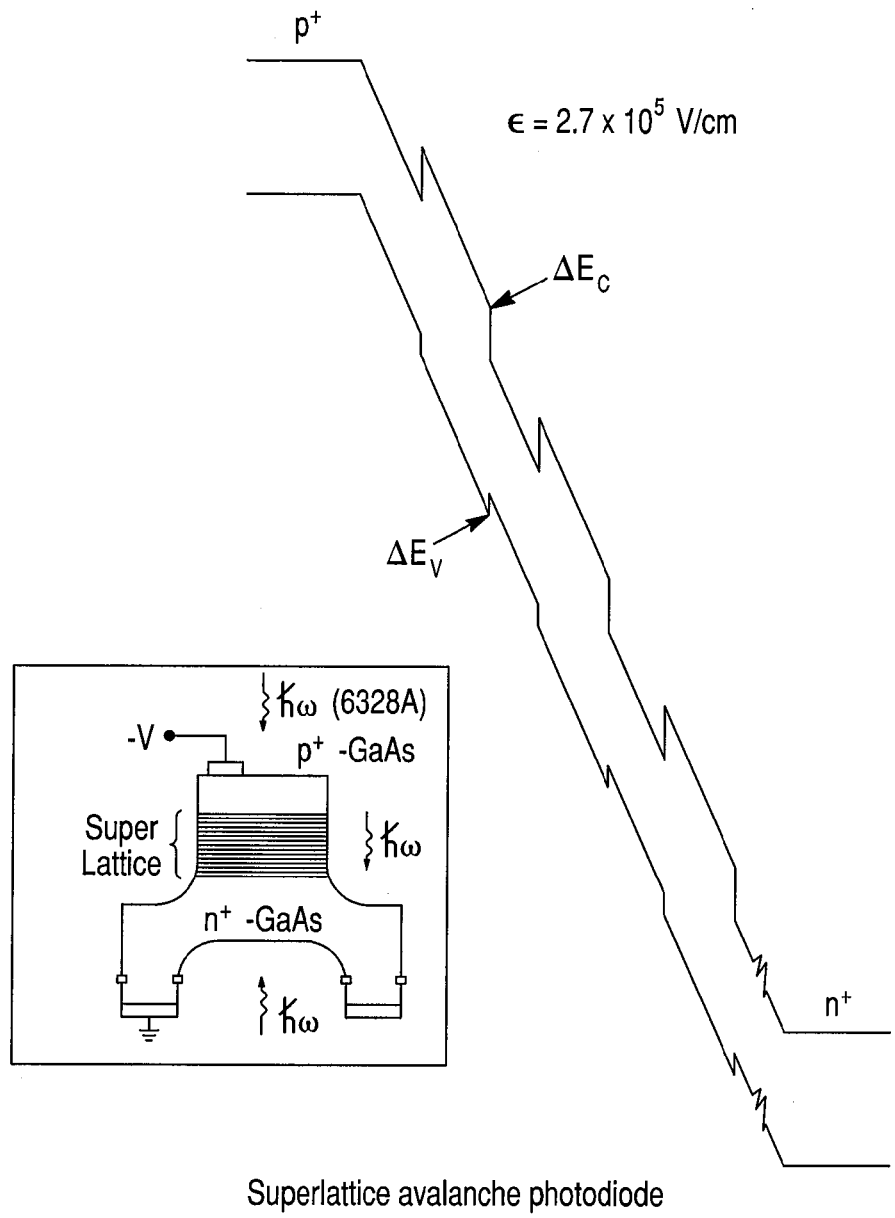
Superlattice avalanche photodiode

APDS USING NANO-PLASMONIC METAMATERIALS

RELATED APPLICATION

This application is a continuation-in-part application of U.S. application Ser. No. 13/243,342, filed Sep. 23, 2011, entitled NANO-STRUCTURE ARRAYS FOR EMR IMAGING, the entire contents of which are incorporated by reference.

FIELD OF INVENTION

The present disclosure relates to an avalanche photo-diode (APD) including nano-particle materials.

BACKGROUND

Avalanche photo-diodes (APDs) have been used as electromagnetic radiation (EMR) detectors, and have applications, such as for single photon counting experiments, imaging and telecommunications.

There are different styles of APDs, including 'reach-through' (RAPD), separate absorption-multiplication regions (SAM), separate absorption grading and multiplication (SAGM)—and super-lattice stair-case band-gap designs, which are admixtures of these concepts. For all of these APD designs, incident EMR is absorbed as much as possible in some semiconductor region (absorption region), and the resulting electrons are then fed efficiently to a p-n junction region (multiplication region) where avalanche multiplication occurs, either just above or just below the Geiger-breakdown 'knee-' characteristic of the APD design.

FIG. 1 schematically illustrates a typical separate absorption region 10 and multiplication region 20 of an APD structure known as a SAM-APD. In FIG. 1, photons get absorbed in an n⁻ or π-region, the absorption region 10, and the resulting photoelectrons are then multiplied in the p-n interface region, i.e., the multiplication region 20. Schottky-barrier APDs with n-type silicon substrates are particularly useful for high-speed detectors and for detection of ultra-violet (UV) light. Normally the UV light is transmitted through a thin metal layer and absorbed in the first 10 nm or so of the silicon. The carrier multiplication is then mainly due to electrons, resulting in low noise. Photo-excitation over the barrier extends the wavelength-range beyond that of the band-gap. FIG. 2 illustrates an APD with a relatively thick π absorption region of about 50 microns.

More sophisticated and complicated device structures have been developed with the intent of to reducing the k value, the ionization rate ratio of holes to electrons, of the APD to be as small as possible to reduce the noise level of the device, and increase its useful performance. FIG. 3 illustrates a super-lattice APD based on III-V semiconductor materials, such as GaAs, with a performance close to silicon, which is a group IV semiconductor material. FIG. 4A illustrates a separate absorption charge multiplication structure (SACM-APD) which permits different electric fields in the absorption and multiplication regions, while FIG. 4B illustrates a SAM-APD. With traditional p-n junction APD devices and absorption processes, the operating temperature substantially affects both the noise level and bias voltage point of the Geiger breakdown in APDs.

What is needed is an APD device with low k values to allow for high photo-level detection performance, even at room temperature. The absence of the need for cooling the detector while maintaining high performance would allow for a device with very low weight and power consumption, and would provide for a detector for applications in the lowest light level environments, such as heavily overcast starlight at night.

SUMMARY OF INVENTION

According to one embodiment of the invention there is provided an avalanche photodiode (APD) electro-magnetic radiation (EMR) detector. The APD EMR detector comprises: an EMR absorption region comprising a substantially regular array of nano-particles embedded in a matrix material; a voltage biasing element configured to apply a bias voltage to the matrix material such that electrical current is directly generated in the EMR absorption region based on a cooperative plasmon effect in the detector material when electro-magnetic radiation in a predetermined wavelength range is incident upon the detector material, where the dominant mechanism for decay in the cooperative plasmon effect is non-radiative; and a charge multiplication region arranged relative to the EMR absorption region to avalanche multiply the electrical current generated in the EMR absorption region.

According to an aspect of the embodiment, the detector has an ionization rate ratio of about 0.0004 or less.

According to an aspect of the embodiment, the nano-particles comprise metal, semiconductor, or doped oxide material.

According to an aspect of the embodiment, the predetermined wavelength range includes one or more ranges inclusively between the deep ultraviolet and long wave infrared regions.

According to an aspect of the embodiment, the matrix material comprises a conductive contact material having ohmic or Schottky barrier properties with respect to the embedded nano-particles.

According to an aspect of the embodiment, the nano-particles comprise semiconductor material, and the matrix material comprises a conductive contact material having ohmic or Schottky barrier properties with respect to the embedded nano-particles.

According to an aspect of the embodiment, the nano-particles comprise at least one of a metal, a semiconductor, a doped oxide, or graphene, and the matrix material comprises at least one of a Group IV, a Group II-VI, or a Group III-V semiconductor material.

According to an aspect of the embodiment, the nano-particles comprise gold.

According to an aspect of the embodiment, the array comprises a plurality of detector elements, each detector element comprising respective groups of nano-particles.

According to an aspect of the embodiment, each group of nano-particles is arranged to optimally detect EMR in a different wavelength range.

According to an aspect of the embodiment, the detector elements are vertically spaced with respect to each other.

According to an aspect of the embodiment, the detector elements are horizontally spaced with respect to each other.

According to an aspect of the embodiment, the different wavelength ranges include ranges inclusively between the deep ultraviolet and Terahertz regions.

According to an aspect of the embodiment, one of the detector elements is arranged to optimally detect EMR in the long wave infrared region, the one of the detector elements being sandwiched between a vacuum or aerogel layer.

According to an aspect of the embodiment, each group of nano-particles is arranged to optimally detect EMR with a different polarization direction.

According to an aspect of the embodiment, the matrix material comprises a heterojunction, and the nano-particles are embedded in or adjacent to the heterojunction.

According to an aspect of the embodiment, the voltage biasing element comprises a first electrode on a first side of the matrix material and a second electrode on a second side of the matrix material, the nano-particles arranged between the first and second matrix material.

According to an aspect of the embodiment, the EMR absorption region comprises one of a p-n region, a p-i-n region, or a π-region.

According to an aspect of the embodiment, the detector is a solar cell.

According to an aspect of the embodiment, the detector is a focal plane array.

According to an aspect of the embodiment, the shape of the nano-particles is one of cylindrical, spherical, cubic, rectangular-cubic, ellipsoidal, planar, near-planar or spiral-twisted.

According to an aspect of the embodiment, the nano-particle sizes are in the region between a characteristic dimension of 0.1 nm to 2000 nm.

BRIEF DESCRIPTION OF DRAWINGS

FIG. 3 illustrates a conventional superlattice APD structure based on III-V semiconductor materials.

DETAILED DESCRIPTION OF THE INVENTION

Figure 1:
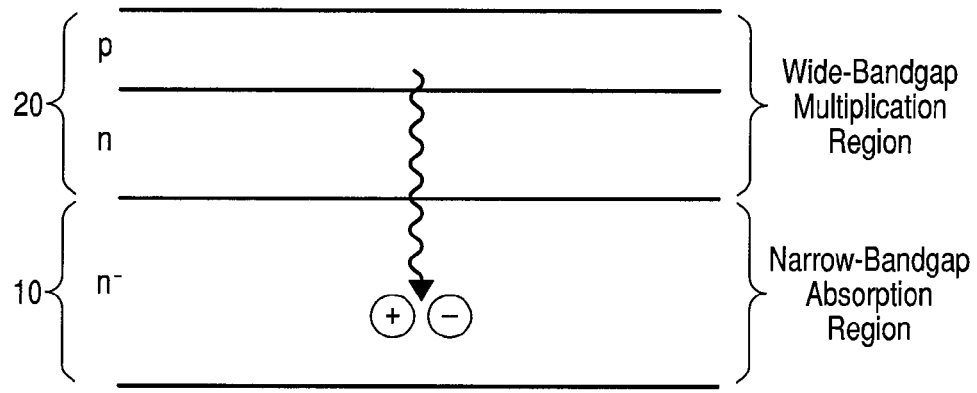
FIG. 1 is a schematic diagram illustrating a separate absorption region and a multiplication region of a conventional APD structure.
Figure 2:
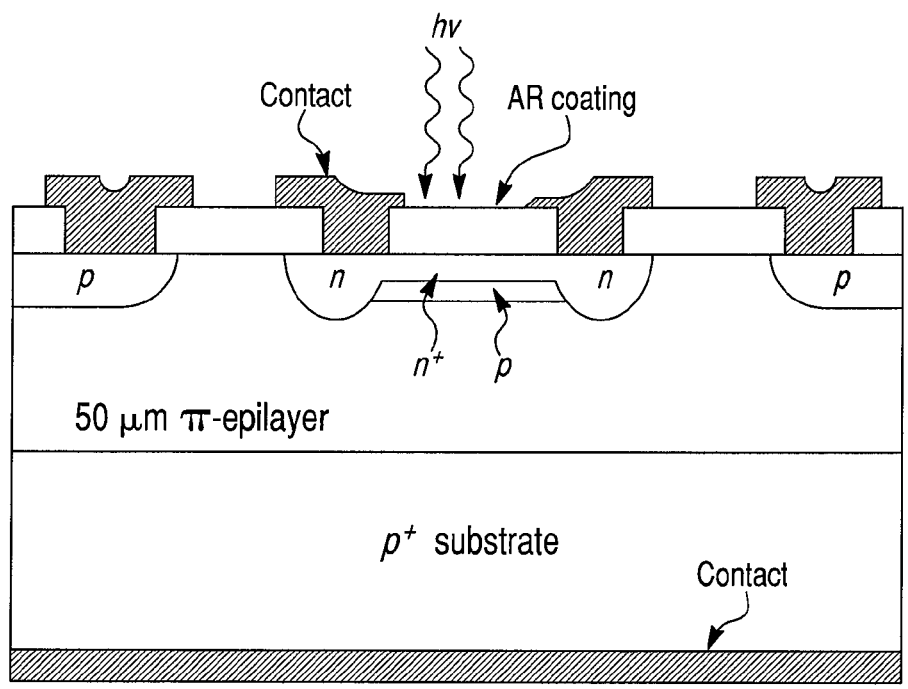
FIG. 2 illustrates a conventional APD structure with a relatively thick absorption region.
Figure 4A:
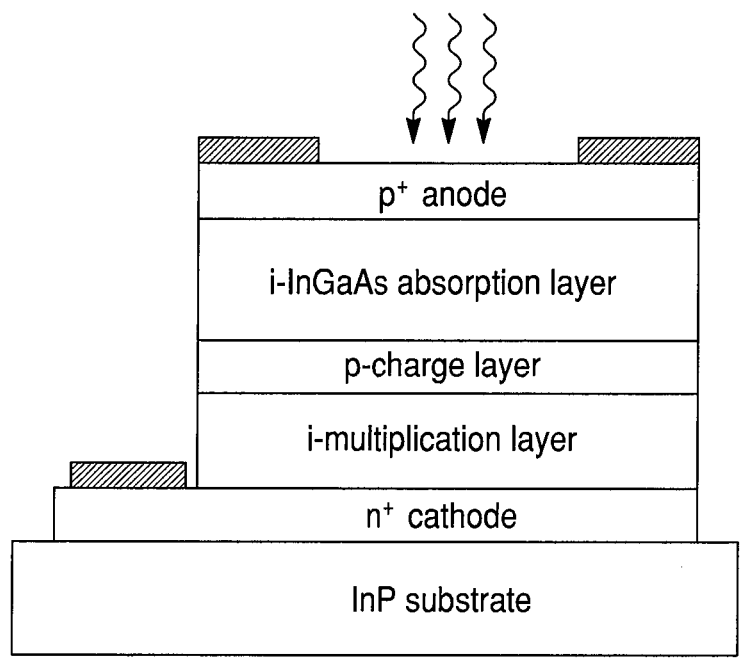
FIGS. 4A and 4B respectively illustrate a conventional SAM-APD and SACM-APD.
Figure 4B:
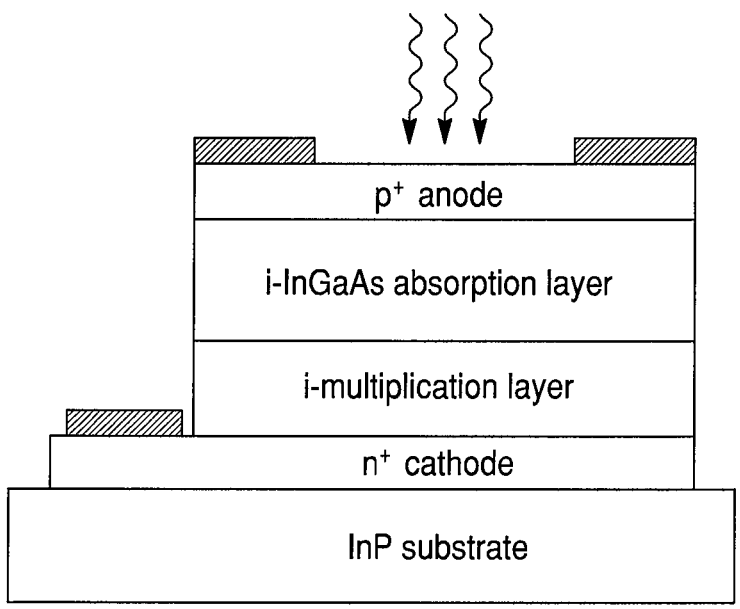

Applicants have found that according to certain embodiments by appropriately selecting the geometry and materials for a detector material comprising a substantially regular array of nanoparticles embedded in a matrix material, and by applying an appropriate bias voltage to the matrix material, a direct electrical current may be generated in an EMR absorption region based on a cooperative plasmon effect in the detector material when EMR in a desired wavelength range is incident upon the detector material, and where the dominant mechanism for decay in the cooperative plasmon effect is nonradiative. The direct electronic mechanism used for detection has advantages over other current detection systems for EMR detection. A charge multiplication region arranged relative to the EMR absorption region may be used to avalanche multiply the electrical current generated in the EMR absorption region.

In one embodiment, a primary focus is the use of plasmonic effect maximized absorption by nanoparticles, such as metal or doped oxide nanoparticles, embedded in a matrix material, such as a semiconductor material, for the purpose of detecting incident EMR. In one embodiment, this mechanism has precisely the opposite effect which has been used in many optical nanoparticle systems, where the employment of a plasmonic effect is used to maximally scatter incident EMR into the surrounding semiconducting matrix material to enhance the EMR absorption in that material.

According to certain embodiments, applicants have further realized how ultra-low k values can be achieved using nano-plasmonic principles, where such k values are critical to very high performance, ultralow noise photo level detection performance of APDs. This is because of the natural unipolar nature of the electrical properties of the detector when employing nano-plasmonics together with a Schottky barrier. When the dominant carrier in the uni-polar device is electrons, k approaches zero, which, as a consequence leads to ultra low noise APD properties even at room temperature operation. Such ultra low noise performance is very valuable in imaging devices and systems, and can offer more than 10× performance beyond noisy InGaAs detectors currently used.

The use of nano-plasmonics in an APD provide a high Responsivity for the APD detector. Predicted very high NIR (near infrared)-SWIR (short wavelength infrared responsivity) and the absence of the need for cooling the detectors to achieve near ideal D* (Specific Detectivity) photo-voltaic performance (i.e., very low weight and power consumption) provide an attractive detector for applications in the lowest light level environments, such as heavily over cast starlight at night. Thus, the nano-plasmonics APD design described here may provide all of ultralow k and noise, very high Responsivity and D*, with no cooling needed, which provides significant advantages for a single photon level night time detector used in the VIS (visible)-NIR-SWIR spectral regions.

An important concept in the nano-plasmonics APD designs disclosed here is the replacement of the currently ubiquitous semiconductor EMR absorption region, by a lattice structured nano-plasmonic meta-material absorber. The concept of a lattice structured nano-plasmonic meta-material absorber is described in detail in U.S. application Ser. No. 13/243,342, filed Sep. 23, 2011, entitled NANO-STRUCTURE ARRAYS FOR EMR IMAGING, incorporated by reference herein in its entirety. The nano-plasmonic APD designs disclosed here allow for EMR absorption in the nano-particles under conditions sufficient to release electrons as through a modified Schottky barrier unipolar transport process. An important part of the physics is the long decay-time of the collective interactions, which enable the electrons to interact with the Schottky barrier.

Further by using localized plasmon absorption instead of the traditional band gap absorption process in traditional APDs, multiple specific wavelengths may be detected, which are widely spaced spectrally, and further different EMR polarizations may be detected.

The modified Schottky barrier designs described allow for the operation of APDs in a less temperature sensitive manner. While the depletion region, gain region and Schottky barrier regions are still temperature sensitive, the overall device sensitivity to operating temperature is expected to be less than for standard APD designs.

Embodiments

Figure 5A:
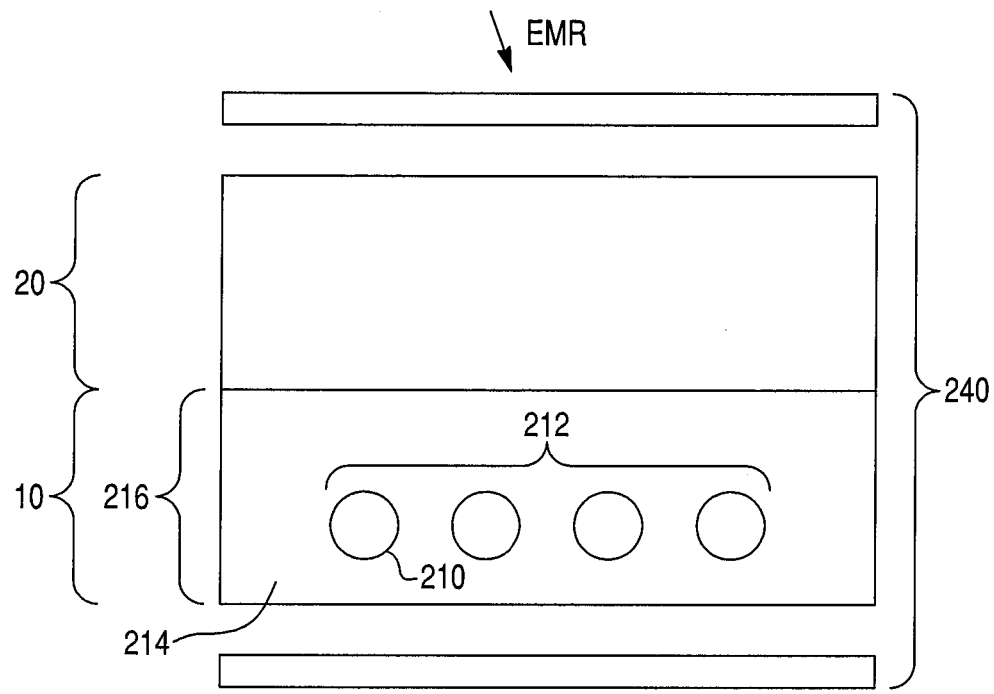
FIG. 5A is a schematic of an APD EMR detector according to an embodiment of the invention.

FIG. 5A illustrates a schematic of an APD EMR detector according to one embodiment. The APD EMR detector includes an EMR absorption region 10, which is the detector material 216, a voltage biasing element 240, and a charge multiplication region 20. The detector material 216 includes a substantially regular array 212 of nanoparticles 210 embedded in a matrix material 214. The voltage biasing element 240 is configured to apply a bias voltage to the matrix material 214 such that electrical current is directly generated based on a cooperative plasmon effect in the detector material when electromagnetic radiation in a predetermined wavelength range is incident upon the detector material, where the dominant mechanism for decay in the cooperative plasmon effect is nonradiative. The charge multiplication region 20 is arranged relative to the EMR absorption region 10 to avalanche multiply the electrical current generated in the EMR absorption region 10.

The nanoparticles 210 and the matrix material 214 may comprise a variety of materials. The nanoparticles 210 may comprise a metal, doped oxide or a semiconductor material, for example. The matrix material 214 may comprises a conductive contact material having ohmic or Schottky barrier properties with respect to the embedded nano-particles 210. The nano-particles 210 may comprise semiconductor material, and the matrix material 214 may comprise a conductive contact material having ohmic or Schottky barrier properties with respect to the embedded nano-particles 210. The nano-particles 210 may comprise at least one of a metal, a semiconductor, a doped oxide, or graphene, and the matrix material 214 may comprise at least one of a Group IV, a Group II-VI, or a Group III-V semiconductor material.

The matrix material 214 may comprise a heterojunction, and the nano-particles 210 may be embedded in or adjacent to the heterojunction. The EMR absorption region 10 may comprise one of a p-n region, a p-i-n region, or a π-region.

The APD detector may be a solar cell, a focal plane array, or other detector for example.

The nano-particles may be of different sizes and shapes. The shape of the nano-particles may be one or more of cylindrical, spherical, cubic, rectangular-cubic, ellipsoidal, planar, near-planar or spiral-twisted, for example. The nano-particle sizes may be in the region between a characteristic dimension of 0.1 nm to 2000 nm.

Figure 5B:
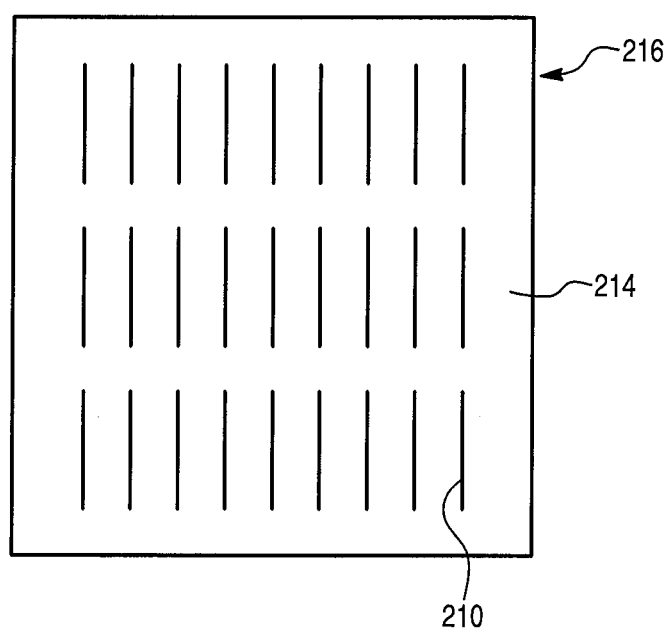
FIG. 5B is a top schematic view of the detector material of the detector of FIG. 5A.

FIG. 5B illustrates a top schematic view of the detector material 216 with a regular array of the nano-particles 210 embedded in a matrix material 214.

Figure 6:
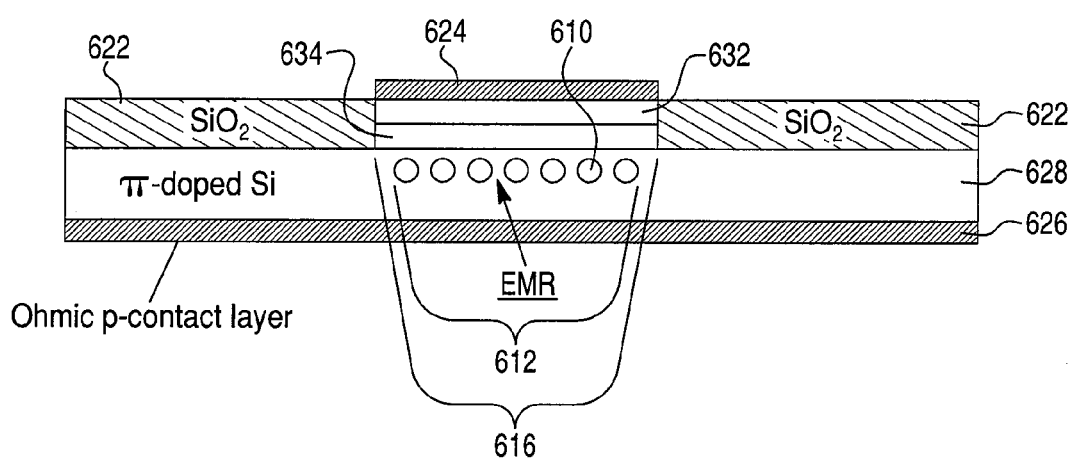
FIG. 6 is a schematic of an APD EMR detector with an n-p-π-p structure according to an embodiment of the invention.

FIG. 6 illustrates an APD n-p-π-p structure according to an embodiment, with the absorber region being a nano-particle array EMR absorber. FIG. 6 illustrates an APD EMR detector where nanoparticle absorber arrays are used to replace the standard absorption region of an avalanche photodiode to improve its performance. The standard π-region is replaced by metal or doped oxide nanoparticles for carrier creation prior to employing the p-n avalanche effect on the photoelectrons. This design is especially advantageous for single-photon counting enhancement using very weak, 'photon-starved' light fields.

The detector in FIG. 6 includes a detector material 616 (the EMR absorption region) in a substrate 628, a top electrode 624, and a bottom electrode 626, where the top electrode and bottom electrode function as the voltage biasing element. The detector material 616 comprises a substantially regular array 612 of nanoparticles 610 embedded in a matrix material, i.e., the π-region of the substrate 628, which may be doped silicon. In this embodiment the nano-particles 610 may be gold nano-rods or doped oxide nano-rods. The detector in FIG. 6 further includes in order from the top electrode 624 to the substrate 628 a n-region 632 and a p-region 634, which may be doped silicon as is known for avalanche photodiode structures. As shown in FIG. 6, laterally surrounding the n-region 632 and p-region 634 is a surface passivation layer 622. The n-region 632 and p-region 634 comprise the charge multiplication region.

Figure 7A:
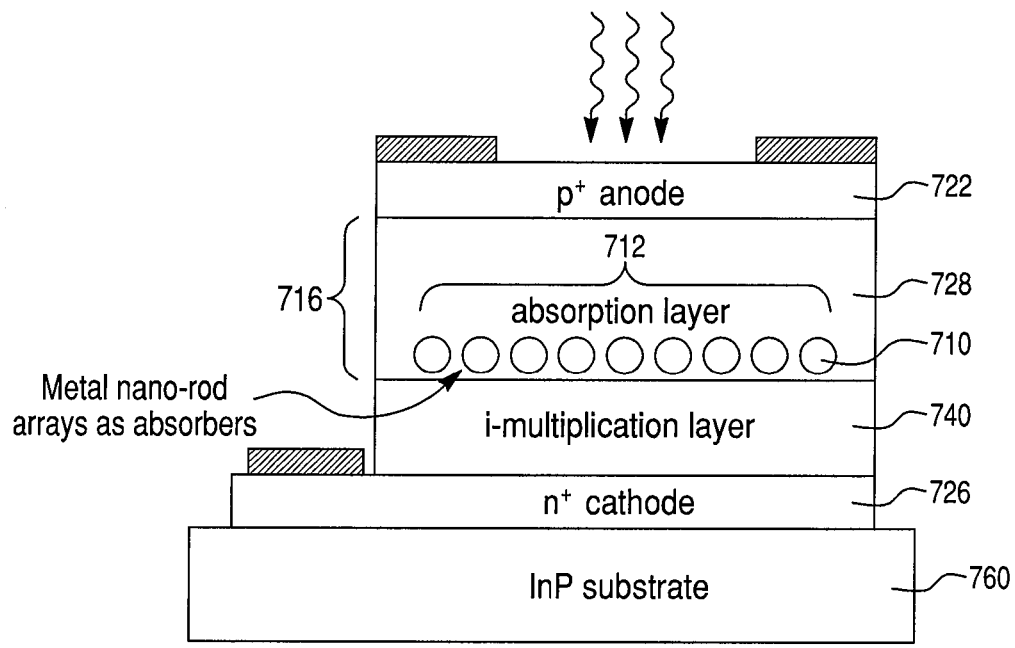
FIGS. 7A and 7B are schematics of APD EMR detectors of SAM-APD and SACM-APD designs, respectively, according to embodiments of the invention.
Figure 7B:
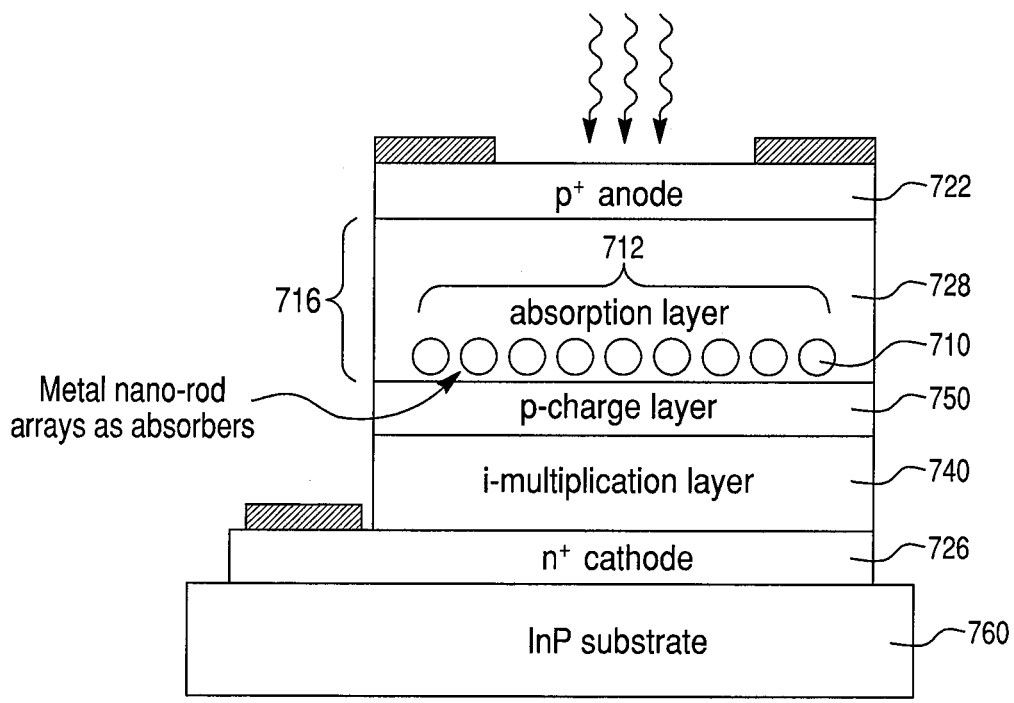

FIGS. 7A and 7B illustrate embodiments of a nano-plasmonic APD design of a SAM-APD and a SACM APD respectively, where the absorption region is a nano-particle detector region. The detectors in FIGS. 7A and 7B are similar, except that the SACM APD of FIG. 7B further includes a p-charge layer 750, which may be silicon or InP, or InGaAs, for example. The detectors in FIGS. 7A and 7B include a detector material 716 (the EMR absorption region), which may be silicon or InP, for example, in a matrix 728, a top electrode 724, and a bottom electrode 726, which may be InP or InGaAs, for example, where the top electrode and bottom electrode function as the voltage biasing element. The detector material 716 comprises a substantially regular array 712 of nanoparticles 710, which may be gold or silver or doped oxide, for example, embedded in a matrix material 728, which may be silicon or InGaAs, for example. The bottom electrode 764 may be formed on a substrate 760, which may be InP, for example.

Device Performance Parameters Including Low k Values

The ionization rate-ratio for holes to electrons, k may be expressed as:

$$k = \beta_p / \alpha_n,$$

for electron injection, where $\beta_p$ is the hole ionization coefficient, and $\alpha_n$ is the electron ionization coefficient.

The k values for APD structures with nano plasmonic meta material absorption regions may be determined. With the nano plasmonic meta-material absorption region of the APD structures described here, unipolar device operation (electrons only) is created because of the nano-particle-semiconductor interface's Schottky barrier. Because the carriers are mostly electrons, and there are virtually no holes, the ratio of holes to electrons, i.e., k, is very nearly zero. Under these circumstances the excess noise in the APD falls to nearly zero.

The excess noise, F, and k are related by the following equation:

$$F = kM + (1-k)(2-1/M),$$

where M is the electron multiplication, or gain. k is ~0.02 to 0.04 for most silicon based APDs, and ~0.3 to 1 for other materials. The best Si k values known are ~0.004.

Figure 8:
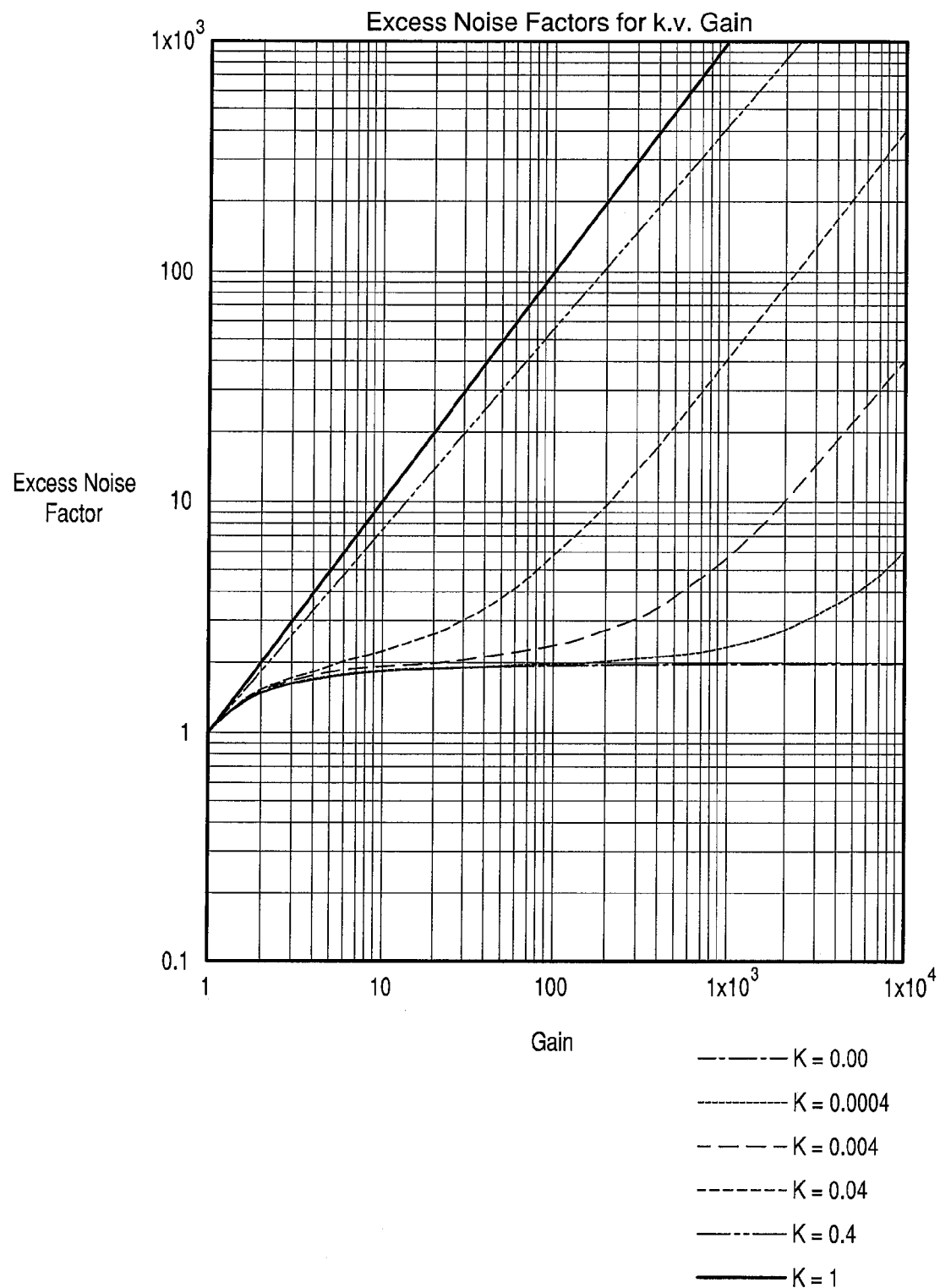
FIG. 8 is a graph showing the excess noise factor as a function of gain for different k values.

FIG. 8 illustrates the excess-noise, F, as a function of gain, M, for various values of k. In an ideal APD, with only electrons contributing as the carriers, k would be zero, and the excess noise factor, F, is 2.0 for all reasonable gains, i.e., greater than 10×, as shown. FIG. 8 also illustrates the gain for the best known k values, where k is about 0.004, for conventional silicon based APDs, and for more typical Si APD performance k ~0.04. For k=0.04, the excess noise rises almost linearly with gain on the log plot of FIG. 8 above a gain of ~100. This is only just useable in photon counting experiments and imaging at the single photon level.

The higher k values of 0.4 and 1.0 represent non-silicon APDs, such as InGaAs APDs, which are, by comparison a full order of magnitude more noisy as the gain, M, increases to useful values.

For the nano-plasmonic meta-material designs of FIGS. 6, 7A and 7B, with a k value of 0.0004 or less, the excess-noise would be insignificant at almost all levels of gain, M, as shown in FIG. 8. Thus the nano-plasmonic meta-material APD designs provide a very significant improvement in excess-noise over convention APD designs.

Nano-Particle APD Device, System Design and Performance Parameters

Below is described an APD detector design, and system advantages for an APD detector designed for peak electromagnetic radiation (EMR) absorption at a wavelength of 2.5 microns, which is close to the limit of competitive InGaAs APDs. Substantial performance improvements are found both at the device and at the system levels.

The detector for this evaluation is a square, of 10 microns on side, as one pixel. The matrix material is silicon embedded with gold nano-wires in a set of linear arrays arranged schematically as shown in FIG. 5B. Each gold nano-wire is 10 nm diameter. There are 6600 gold nano-wires in the 10 micron pixel, arranged as 66 nano-wires per row, each spaced optimally, as described below, at 150 nm, with 100 rows.

Figure 9:
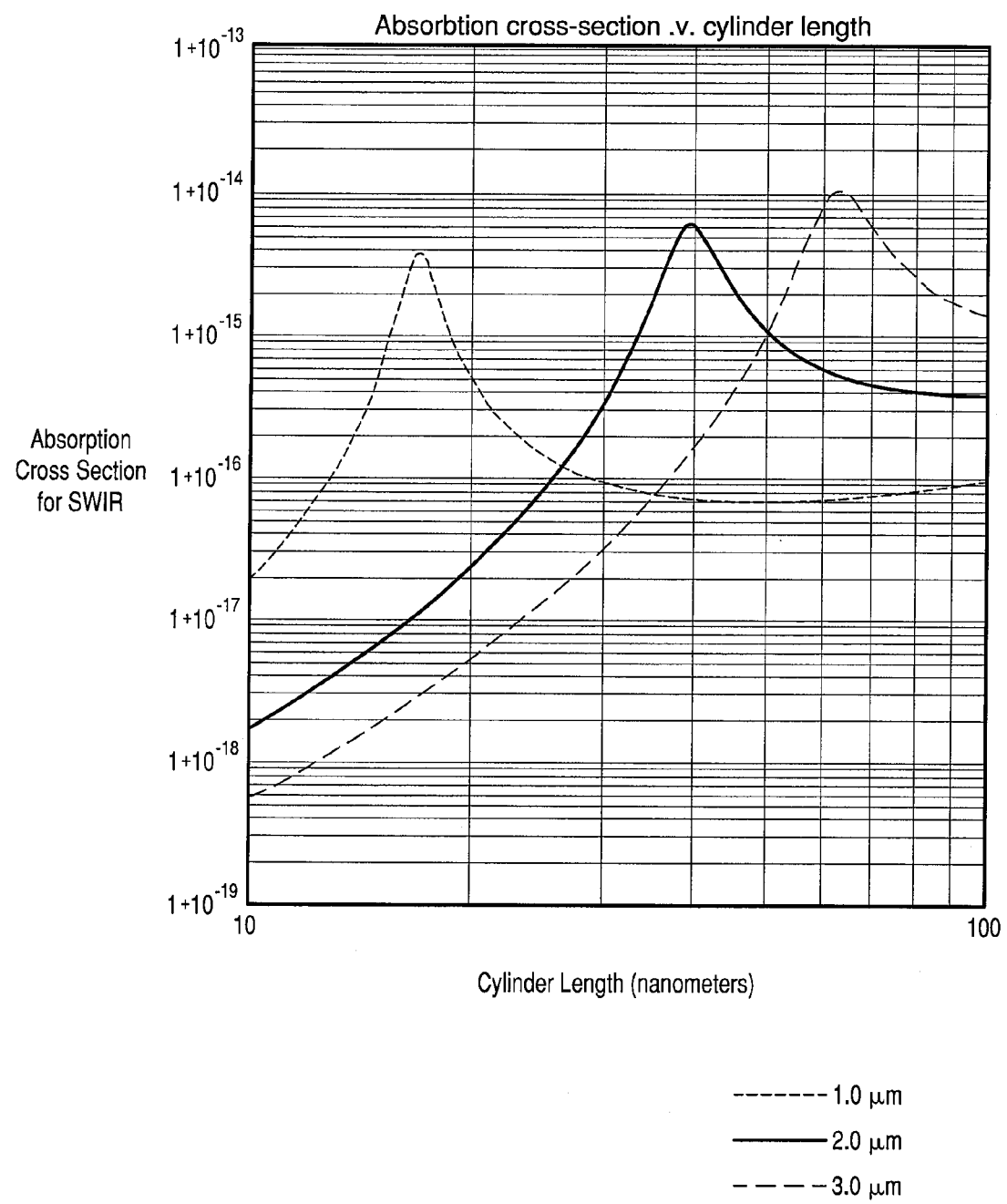
FIG. 9 is a graph showing the absorption cross section as a function of nano-particle length for 1, 2, and 3 micron EMR wavelengths in log scale.
Figure 10:
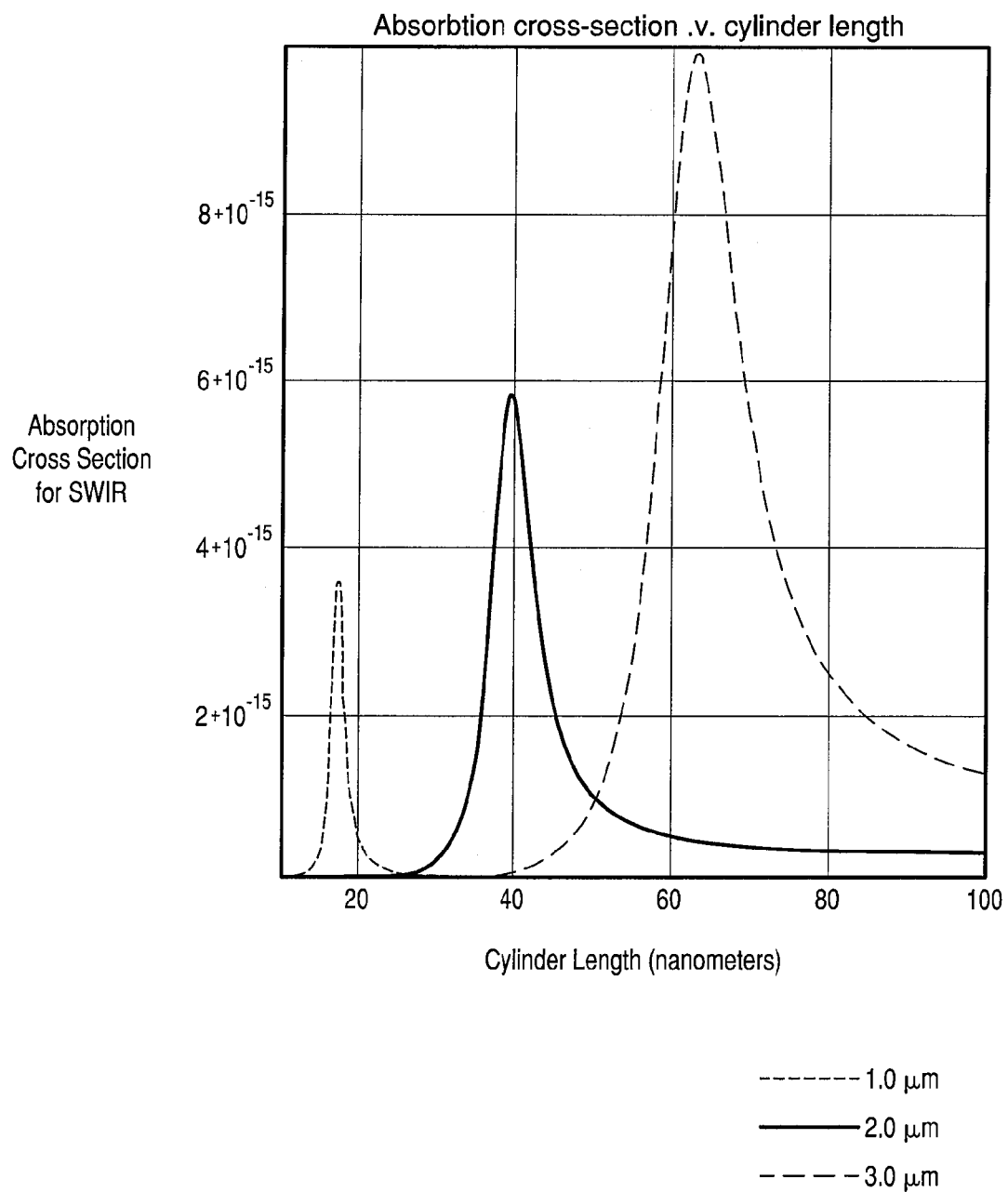
FIG. 10 is a graph showing the absorption cross section as a function of nano-particle length for 1, 2, and 3 micron EMR wavelengths in linear scale.

FIG. 9 illustrates the absorption cross section per nano-wire across the SWIR spectrum at 1, 2 and 3 microns wavelength as a function of nano-wire (cylinder) length. The absorption cross section per nano-wire across the short wave infra-red (SWIR) spectrum at 1, 2 and 3 microns wavelength is shown in FIG. 9 as a function of nano-wire (cylinder) length. By extrapolation using FIG. 9, the optimum nano-wire length for a 2.5 micron wavelength absorption peak sensor is ~50 microns. FIG. 10 illustrates the values of FIG. 9 as a linear plot instead of logarithmic.

Figure 11:
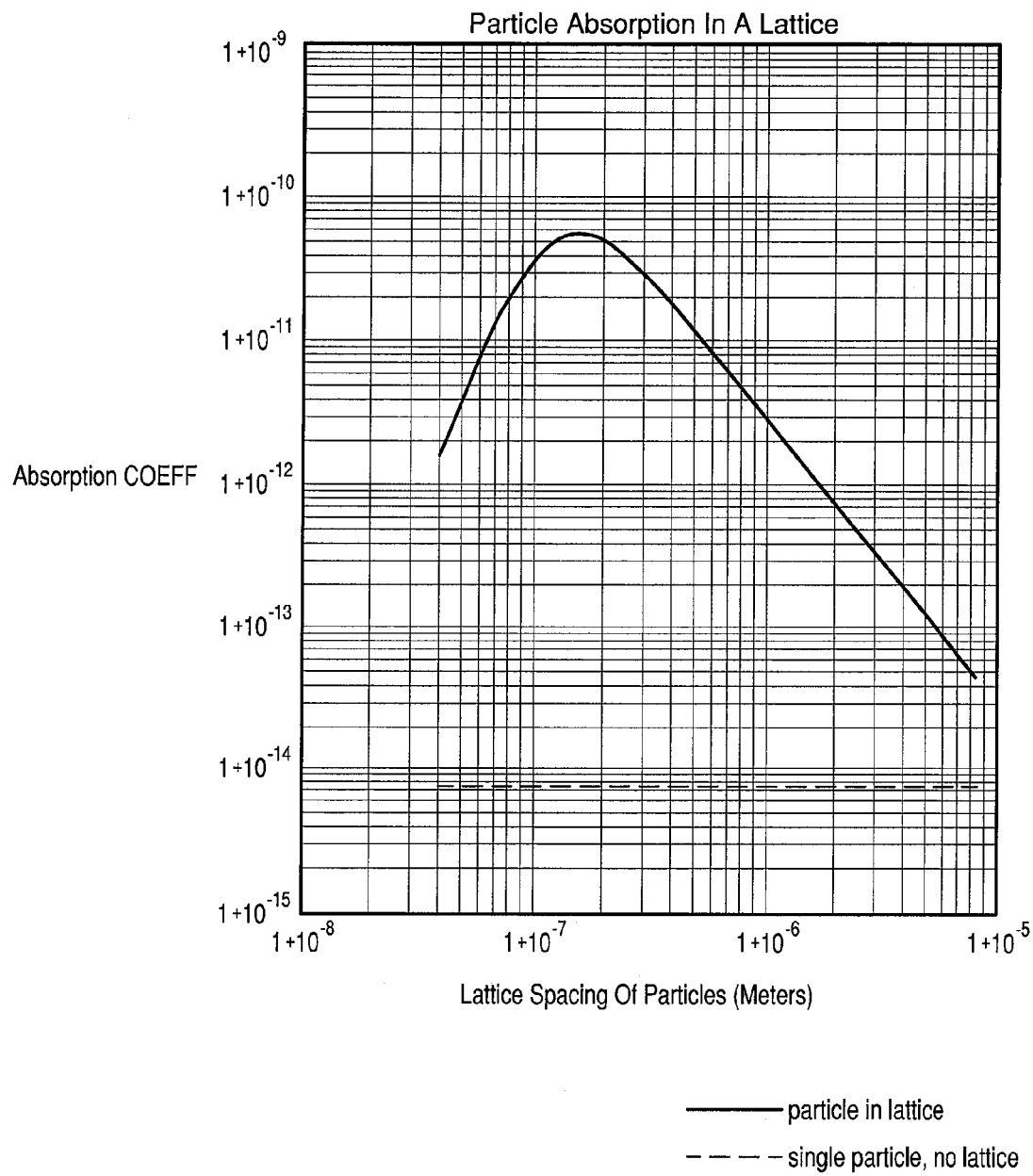
FIG. 11 is a graph showing the absorption coefficient as a function of nano-particle lattice spacing for a nano-particle in a lattice, and a nano-particle not in a lattice.

FIG. 11 illustrates absorption cross section per particle for 50 nm gold nano-wires embedded in silicon as a function of the lattice spacing, and for comparison for a single isolated nano-wire. FIG. 11 shows the enhancement of absorption cross section per particle because it is placed in the row shaped lattice arrangement. The optimal spacing of the nano-wires is 150 nm.

Figure 12:
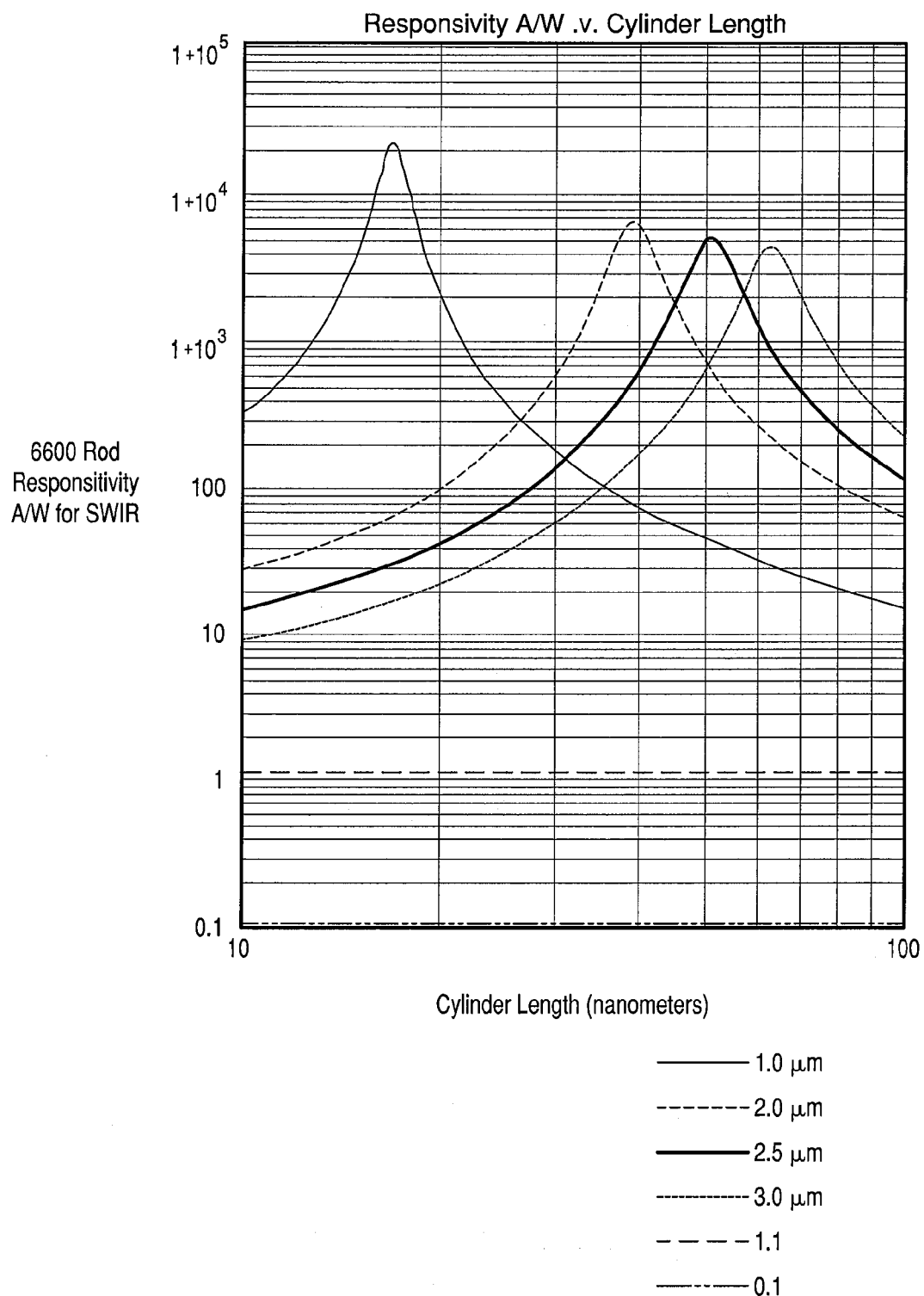
FIG. 12 is a graph showing the Responsivity as a function of nano-particle length for 1, 2, 2.5 and 3 micron EMR wavelengths.

FIG. 12 illustrates Responsivities of the pixel in this design for EMR wavelength of 1.0, 2.0, 2.5, and 3.0 microns as a function of nano-wire length, where the optimal nano-wire length for a maximum Responsivity can be seen to be 50 microns for an EMR wavelength of 2.5 microns.

Room Temperature Performance

The room temperature performance may be determined for a nano-plasmonic SWIR-APD under conditions of use in a Focal Plane Array of an imaging system deployed to image a scene under overcast Magnitude +2 starlight conditions, (virtually black to the human eye) such as may be found when using a digital night vision system. Under these circumstances the APD is now photon counting, and not operating in analog mode.

The system specification is f/1 optics (100 mm focal length lens) of 50% transmission, observing just the 1-3 micron wavelength band. The detector is operated at room temperature, 300 degrees K, that is without cooling. This is possible because the k value for this detector is less than 0.0004; some 10× better than the best known conventional Si APD used for photon counting previously. The n-doping levels here is ~4×10$^{16}$ per cc, where as the background p-doping in the substrate is around 10$^{12}$ per cc.

The relative noise performance of this photon counting APD, based on a nano-plasmonic design, compared to the best previous Si APDs and the best InGaAs APDs is now illustrated.

Figure 13:
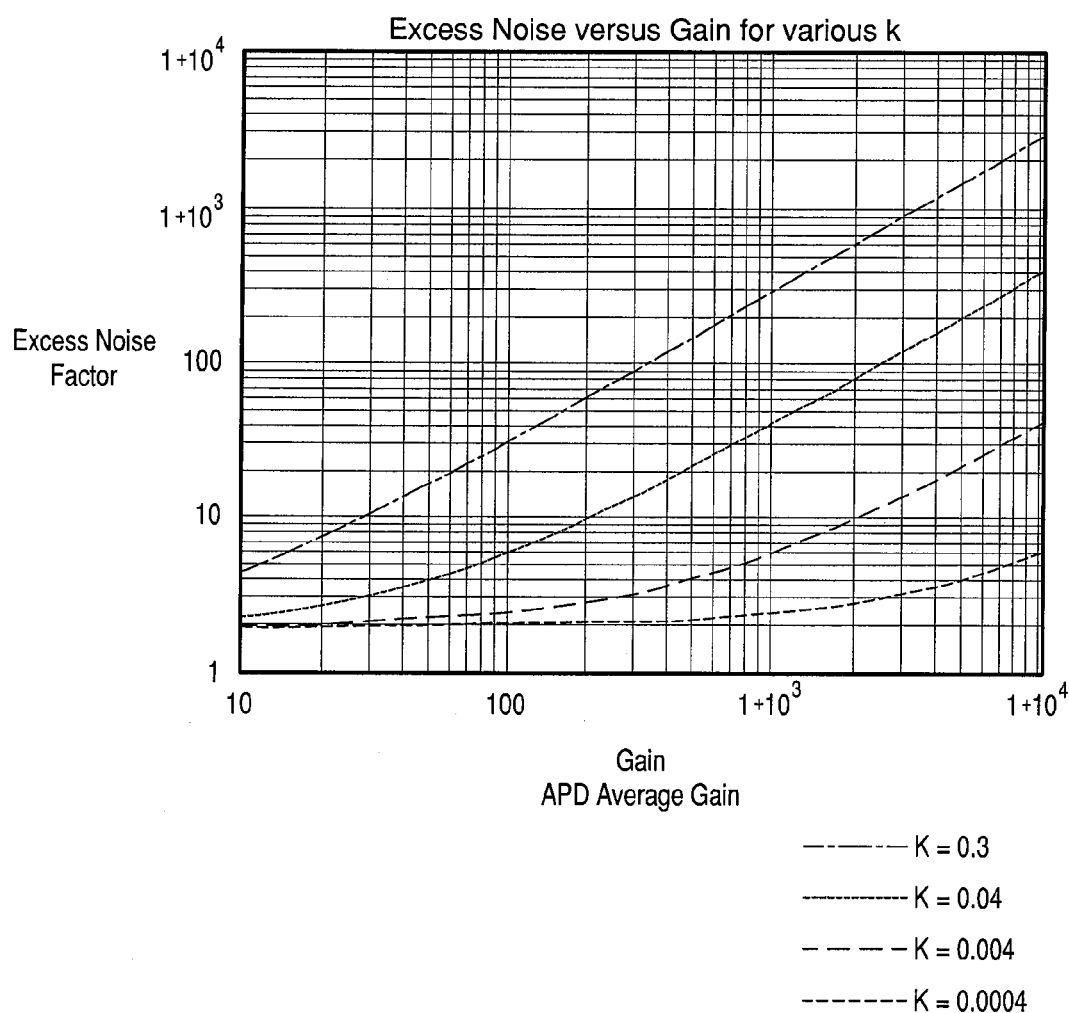
FIG. 13 is a graph showing the excess noise factor as a function of APD gain for different k values.

FIG. 13 illustrates the excess noise factor versus gain for the nano-plasmonic (k of 0.0004), Si (k of 0.04 or 0.004), and InGaAs (k of 0.3) APD designs.

InGaAs APDs typically have values of k of around 0.3 at best. As seen in FIG. 3, for this k value, the noise grows rapidly with gain, which is why InGaAs APDs have to be cooled so much to reduce the noise level.

For the typical Si-APD k value of 0.04, it is also necessary to cool the detector for low noise photon counting operation, but such detectors are inherently around an order-of-magnitude lower in noise than InGaAs for gains exceeding 100 or so.

The best Si-APDs have k ~0.004. Even these APDs require some cooling to just below 300 K in their photon-counting uses.

In the nano-plasmonic APD design described here, however, with k ~0.0004, negligible excess noise growth up to gains of 10,000 or so can be seen in FIG. 13, and noise behavior some three orders of magnitude better than InGaAs operated under 10,000× Gain conditions can be seen.

Figure 14:
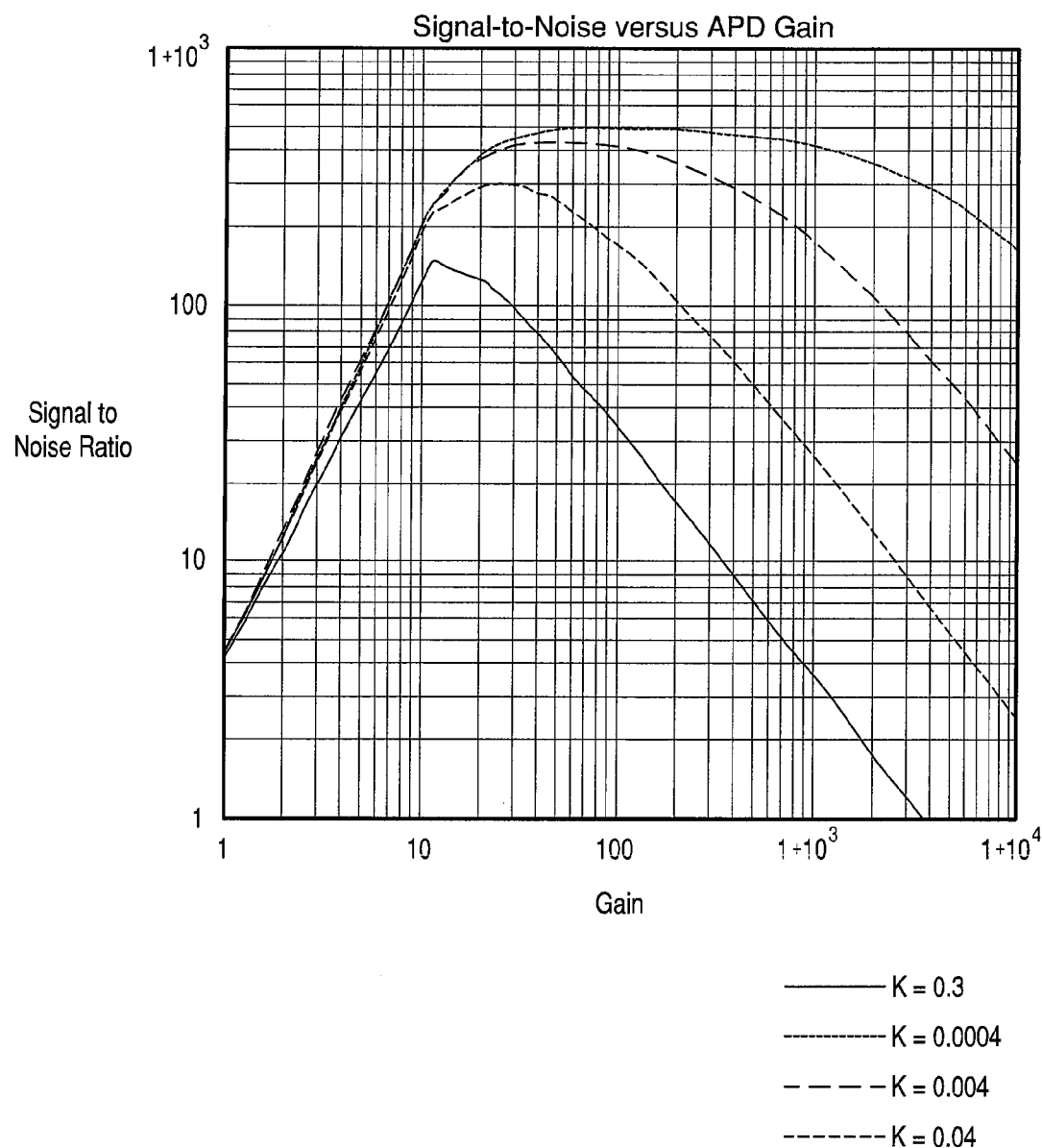
FIG. 14 is a graph showing the signal to noise ratio as a function of APD gain for different k values.

This superior performance of the nano-plasmonic APD design manifests itself in the signal to noise ratios achievable under varying gain conditions, and this is shown in FIG. 14 which illustrates signal to noise ratios as a function of gain for the different k values of FIG. 13 for an average signal of 1000 events/s. In FIG. 14 the relatively poor signal to noise performance can be seen for a typical k=0.3 InGaAs APD compared to the typical Si (k=0.04), best Si (k=0.004), and nano plasmonic Si APD (k=0.0004). At low levels of gain of ~100×, the InGaAs APD is around one order of magnitude worse in S/N performance compared to the best silicon and nano-plasmonic APD performances, but at more reasonable gains of 1000× and more, the best silicon and the nano plasmonic APDs will outperform the InGaAs S/N by two orders of magnitude (100× performance). For the nano-plasmonic APD, gains of 10,000× are possible with little degradation in peak level S/N performance.

From FIGS. 8 and 13, there can be seen a 'sweet spot' where F=2 for gains from ~20 to ~200. From FIG. 14, there is a sweet spot where SNR is a maximum for gains in the vicinity of 100. To avoid operating any closer to the Geiger breakdown voltage than necessary, a gain of 100 is a good operating point, and a gain as high as 1000 is also possible.

Figure 15:
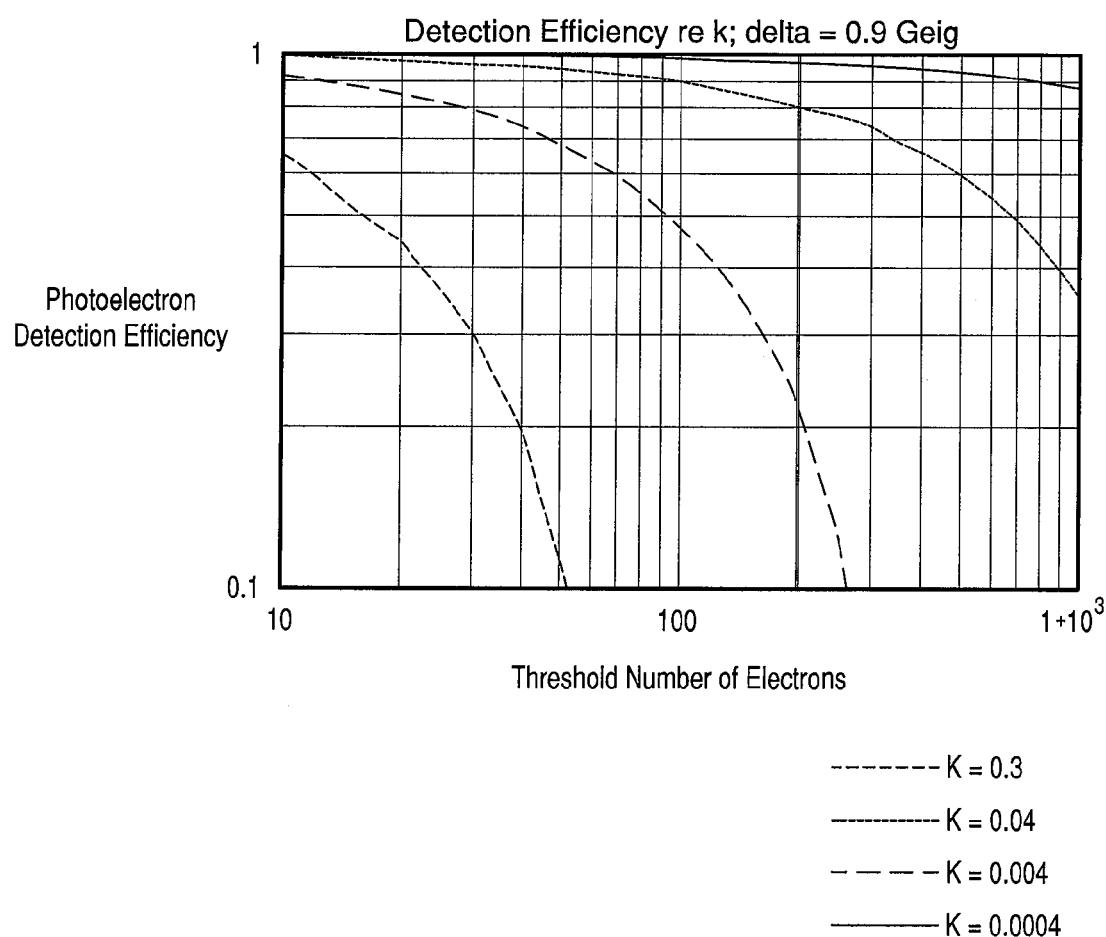
FIG. 15 is a graph showing the photodetection efficiency as a function of the set threshold level of photon counting for different k values.

FIG. 15 illustrates the photo-detection efficiency as a function of the set threshold level for photon counting detection for the nano-plasmonic (k of 0.0004), Si (k of 0.04 or 0.004), and InGaAs (k of 0.3) APD designs. The value k dominates not only the noise performance of any photon counting APD, but also the threshold levels that can be set for a desired level of photodetection efficiency. This is shown graphically in FIG. 15, for APDs operated in the linear-mode at 90% of Geiger breakdown bias.

For InGaAs photon counting performance (k=0.3), the single photoelectron detection efficiency falls rapidly as the electronic threshold level is raised above a few tens of electrons to reduce noise level. However, in the typical Si SPD (k=0.04) the threshold can be set at 100 electrons for 60% probability of photodetection. In the best Si APDs with k=0.004, FIG. 15 shows that for the same 100 electron electronic threshold, the photoelectron detection probability is raised to 90%. But now with the anticipated k performance of the nano-plasmonic APD, at the same 100 electron electronic threshold level, the photoelectron detection probability is raised to 98%, and is still at the 89% level even if the threshold is increased to 1000 electrons.

FIG. 15 illustrates a significant result not only because it shows high detection efficiency, but also because the electronic threshold can be set at ~100 electrons or so for the nano-plasmonic APD. Previously, for high detection efficiency, an electronic noise level was needed of about 30 electrons. FIG. 15 illustrates that ultra low k nano-plasmonic APD detectors may be used to alleviate this severe engineering challenge.

Figure 16:
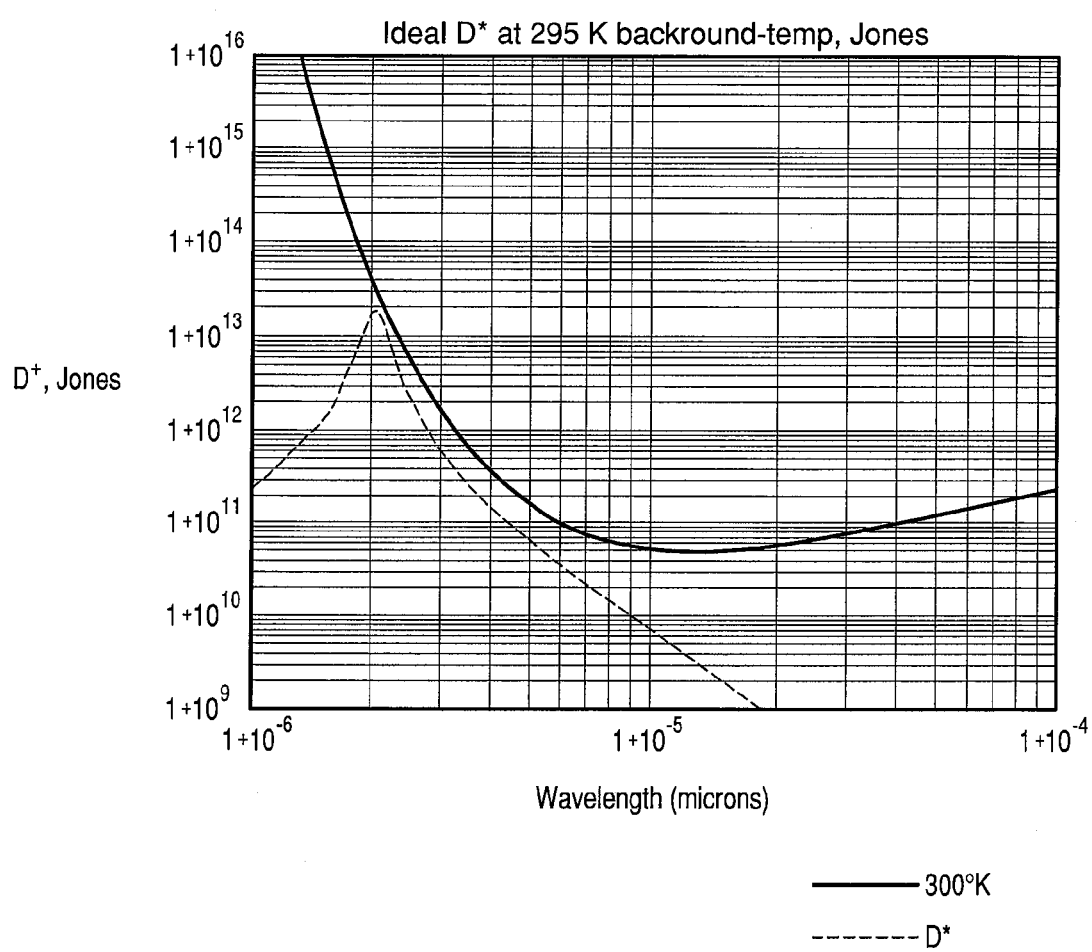
FIG. 16 is a graph showing the specific Detectivity and the standard 300K temperature background photovoltaic detector limit as a function of EMR wavelength.

FIG. 16 illustrates D*, the specific Detectivity, for the nano-plasmonic APD detector described here compared to the standard 300K temperature background photovoltaic detector limit. The curious D* curve shape shown in FIG. 16 for the nano-plasmonic APD detector arises because the modified Schottky detector process used here has no sharp band gap cut off that is typical of all p-n absorption processes, as typically used. In the nano-plasmonic APD, hot electrons surmount the barrier, but at lower energies they tunnel through the Schottky barrier. For the nano-plasmonic APD, there is a unipolar process involving majority carrier electrons, not a p-n process dominated by the holes.

With the ultra-low noise k=0.0004 detectors described here, room temperature photon counting into the MWIR (mid wavelength infrared)/LWIR (long wavelength infrared) regions may be possible. It is usually assumed that photon counting is possible when the photon energy, hv, is less than kT, but noise prevents the ability to operate much beyond the SWIR region, even when the detector is heavily cooled. For T=300 K, room temperature, v corresponds to 48 microns wavelength as the fundamental limit for long wavelength. While thermal noise is a factor; at room temperature, kT is ~0.04 eV, which is 10× below the energy of a 2.5 micron photon.

Embodiments for Specific Multiple Wavelength Detection, Multiple Polarization Detection, and Combined Digital Photon Counting-Analog Current Detection The nano-plasmonic APD design may be used for APDs with the following features:

A. APDs that can detect specific multiple wavelengths, and across different spectral bands;
B. APDs that can detect multiple or arbitrary polarization components of the incident EMR.
C. APDs that can detect digital photon-counts for any or all of VIS, NIR and SWIR EMR radiation, and at the same time be used to detect analog currents due to incident LWIR and/or MWIR.

Devices with feature A may be implemented through arrays of, for example, metal or doped oxide nano-wires (rod, cylinders) of different lengths to select the different wavelength within the APD (pixel). Devices with feature B may be implemented through arrays of, e.g., metal nano-wires oriented at different angles to the plane of polarization of the incident EMR.

Figure 17A:
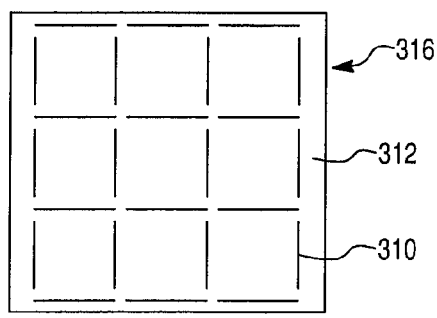
FIGS. 17A, 17B and 17C respectively illustrate a detector having different polarization geometries showing nano-particle arrays with respectively a checker-board geometry, a parallel array geometry, and different parallel array geometries placed in different quadrants in a single pixel.
Figure 17B:
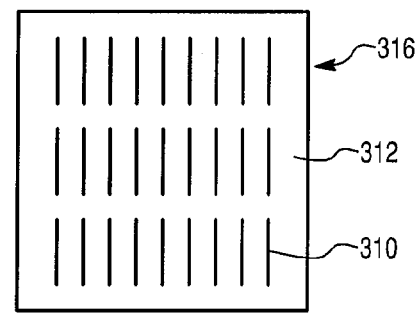
Figure 17C:
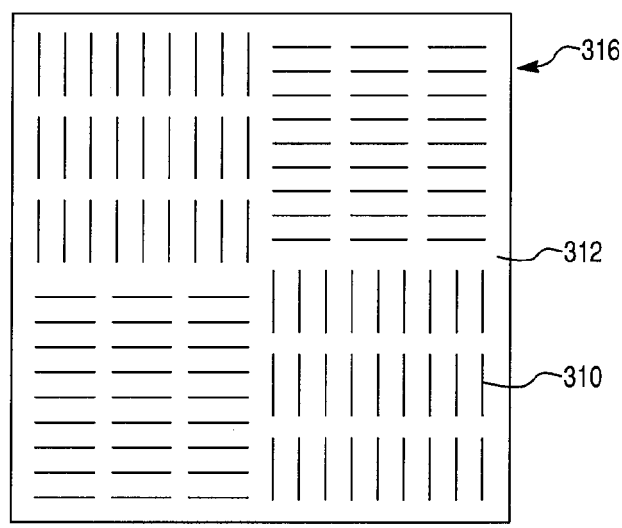

FIGS. 17A, 17B, and 17C illustrate nano-particle arrangement geometries for implementing feature B showing nanoparticles 310 in a matrix material 312 of a detector material 316. The following nanoparticle geometries may be calculated fairly accurately for their polarization and wavelength discrimination potential advantages. FIGS. 17A, 17B, and 17C illustrate different polarization geometries.

The geometry of FIG. 17A offers the possibility of detecting orthogonal 'pure' polarizations within a single pixel by electrically connecting to the rows and columns. FIG. 17B offers the possibility of discriminating a single polarization state in a pixel. FIG. 17C offers the possibility of detecting multiple specific wavelengths, by using rod length variations, and specific polarizations within the same pixel.

When the nanorods are arranged in parallel arrays, per FIG. 17B, the spacing between the rods critically determines the effective polarizability of an individual rod, so that the number of rods may then be summed to get the total effective polarizability of the array. As an example, consider the variation of polarizability of 400 nm long gold nanorods of 20 nm diameter illuminated by 10 micron wavelength LWIR.

Feature A may be implemented by providing nano particle arrays which allow for the detection of multiple wavelengths simultaneous with the same detector. Such multiple wavelength detection can provide advantages in focal plane array (FPA) imaging systems, with the special advantage that two or more wavelengths may be detected simultaneously in the same detector structure. In this regard, the nanorods in different portions of a pixel may be made to have different lengths and aspect ratio that provide a resonance at different specific wavelengths, and/or nanorods may be arranged to detect different polarizations of interest.

Figure 17D:
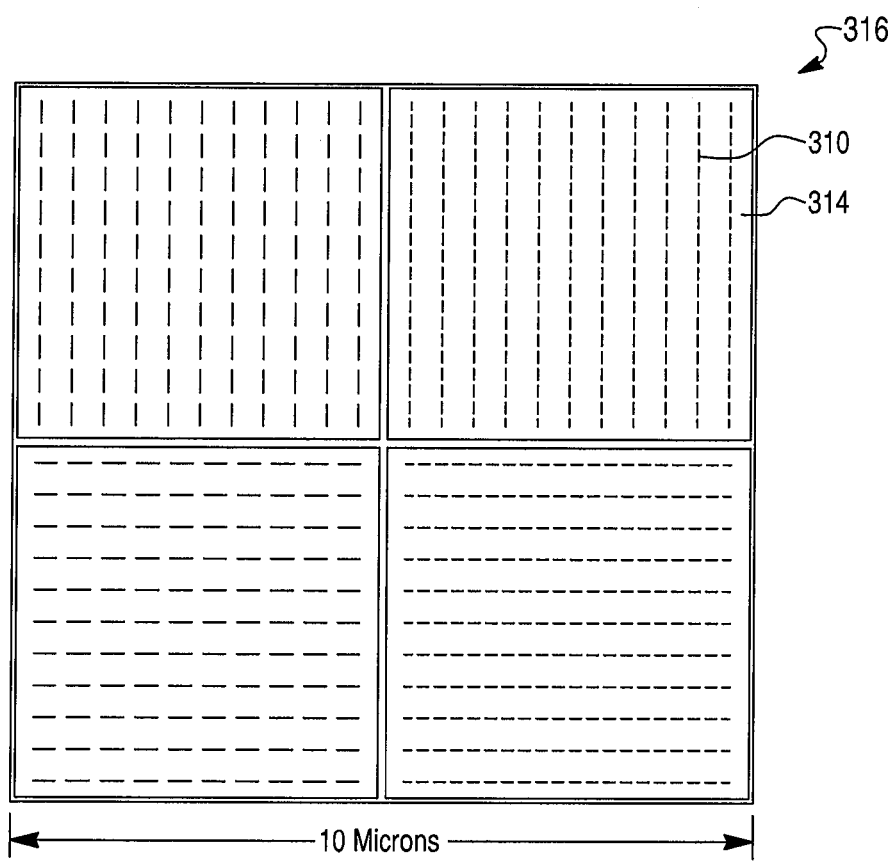
FIG. 17D is a schematic illustrating arrays of differently oriented and length nanorods for wavelength and polarization selectivity in a single pixel detector.

An exemplary nanorod array geometry for this purpose is illustrated in FIG. 17D. The detectors described above apply here as basic detector structures. FIG. 17D shows a possible nanorod layout. FIG. 17D shows arrays of differently oriented, and different length, nanorods for the purposes of wavelength and orthogonal polarization selectivity within a single pixel detector. The different wavelength ranges detected may include ranges inclusively between the deep ultraviolet and Terahertz regions. This structure could be applied across a focal-plane array detector to assist in detection of specific features in the scene being observed.

Figure 18:
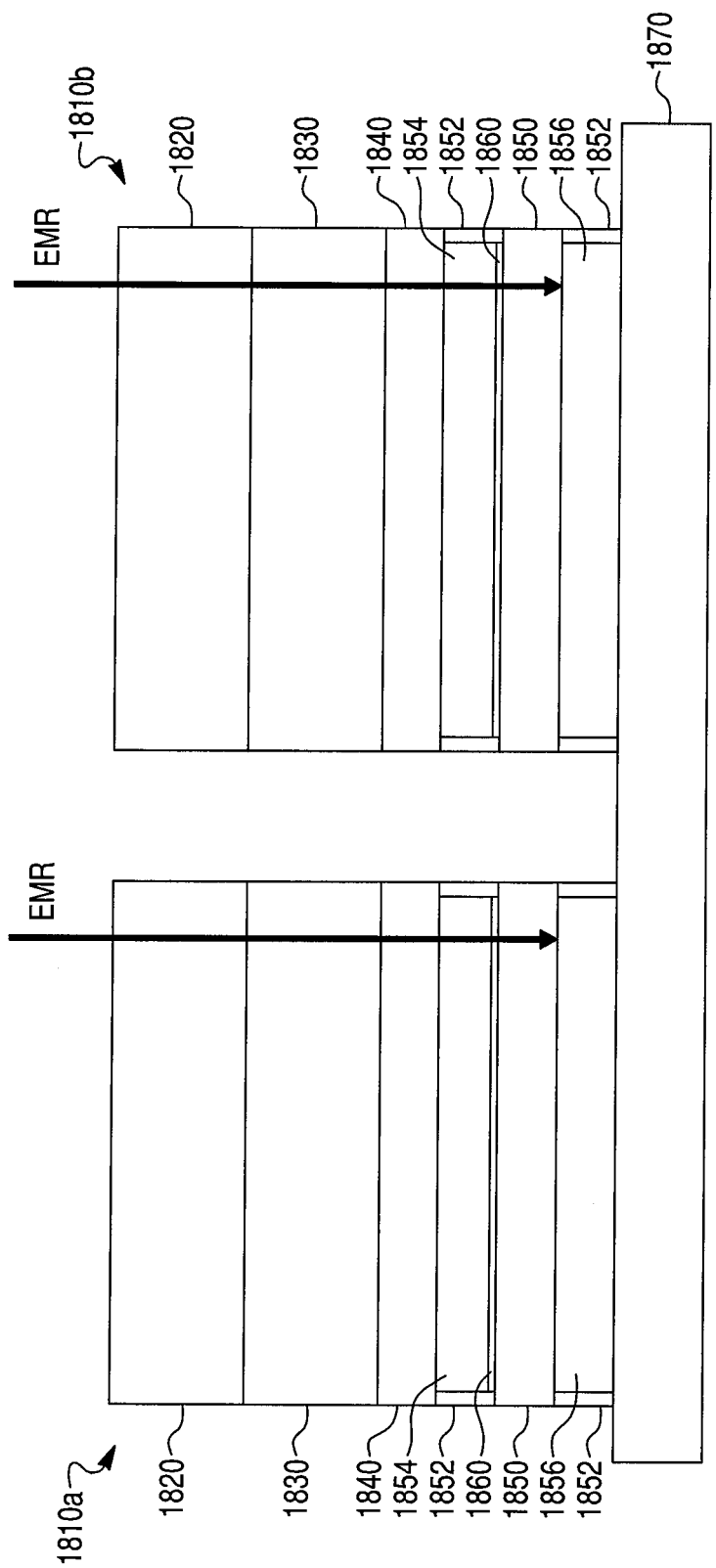
FIG. 18 is a schematic of a multi-spectral APD EMR detector with a stacked detector layer arrangement according to an embodiment of the invention.

A device which implements feature C, detecting digital photon counts for any or all of VIS, NIR and SWIR EMR radiation, and at the same time being used to detect analog currents due to incident LWIR and/or MWIR, is shown in FIG. 18 which illustrate a multistack arrangement. Each detector layer could be for different wavelength ranges, such as NIR, SWIR, MWIR and/or LWIR, or for the detection of different polarization states of the same or differing wavebands, as illustrated in FIGS. 17A, 17B and 17C, for example. The different layers in the stack could be photon counting APDs and/or analog-current detectors for MWIR and/or LWIR.

For simplicity, the separate layers of the multi-spectral detector shown schematically in FIG. 18 is shown without the connecting wires. A feature of such a stacked detector of this kind, as is known generally for stacked detectors, is that unabsorbed light in one layer propagates through to the next layer where it may be absorbed, and propagated again to the next layer if it is still not absorbed.

The APD detector 1800 in FIG. 18 has a first pixel 1810A and a second pixel 1810B, where each of the pixels has multiple APD detector layers 1820, 1830, 1840 and 1850, designed to detect respectively EMR at different wavelength ranges. The different wavelength ranges may include ranges inclusively between the deep ultraviolet and Terahertz regions. The APD detector layers include a first APD detector layer 1820, a second APD detector layer 1830, a third APD detector layer 1840, and a fourth APD detector layer 1850. The first APD detector layer 1820 may be a conventional APD detector for detection in a first spectral region, such as the NIR, VIS and UV area of the EMR spectrum, while the second, third and fourth APD detector layers 1830, 1840, and 1850 are designed for nano-plasmonic detection in other spectral regions. For example, the second, third and fourth APD detector layers 1830, 1840, and 1850 may be designed for nano-plasmonic detection in the SWIR, MWIR and LWIR regions of the EMR spectrum, respectively. Examples, of such nano-plasmonic detectors in the SWIR, MWIR and LWIR regions, and suitable materials therefore, are described in U.S. application Ser. No. 13/243,342, filed Sep. 23, 2011, entitled NANO-STRUCTURE ARRAYS FOR EMR IMAGING. The detector 1800 may further include detection circuitry 1870, such as Si-CMOS circuitry, as is known for stacked detectors.

The stacked first through fourth APD detector layers 1820, 1830, 1840, and 1850 are arranged such that the shortest wavelengths are absorbed in the first (top) layer to be encountered, and the longest wavelengths are absorbed in the final (bottom) layer, so that the radiation can pass through the stack of different nano-plasmonic materials.

The detector 1800 in FIG. 18 may have an aerogel or low pressure insulation region of a top insulation region 1854 and bottom insulation region 1856 sandwiching the fourth APD detector layer 1850, which is for LWIR detection, as is known for LWIR detection layers. The detector 1800 may further include antireflection layers for the detector layers, such as an antireflection layer 1860 on the fourth APD detector layer 1850, which is for LWIR detection.

For the detection circuitry 1870, a CMOS backplane signal processing structure which provides a single electron readout noise CCD (charged coupled device) based concept, may be used to achieve high S/N ratios. This will greatly assist in achieving NETD (noise equivalent temperature difference) values in the milli-Kelvin region, especially as the detector area is reduced in size, because the NETD is inversely proportional to the square root of detector area. Although MTF (modulation transfer function) will be improved using smaller detector pixels, NETD may worsen unless noise-performance is compensated. An ultra-low noise CCD-ROIC (charge coupled device-read out integrated circuit) technology may be used for this purpose.

For LWIR detectors, either CNT (carbon nanotube)-bundle connectors, or thermal-compression bonding techniques using Au—Au, Au/Sn or Au/In or Bi/Sn all having low-temperature melting points, may be used so the integrity of the semiconducting materials used in detection is not adversely affected.

For example, using Au—Au for the LWIR detector, it may be calculated for an XGA detector array (1024×768), using 2×2-micron pads/connectors per pixel and a bond-temperature of 250° C., a pressure of 80 MPa is required for a permanent diffusion-bond, i.e., a mass of 40 kg may be applied across the entire chip when bonding the LWIR layer to the Si-CMOS layer by 2 micron Au—Au interconnections. The use of 2 micron diameter interconnects in place of 10 micron diameter Indium bump interconnects may cause a dramatic improvement in the achieved NETD values, as the interconnect thermal mass is reduced by more than ×25 for same length interconnects. By reducing the typical connector lengths, the interconnect thermal mass may be reduced by about >×50.

The electrical connections from the detection circuitry 1870 to each pixel 1810a and 1810b and APD detector layers 1820, 1830, 1840 and 1850, can be made, for example, either: (1) through fine vertical vias, such as TSVs (through substrate vias) of metal wires, such as gold or copper, used for supporting the structure, or (2) through a standard x,y matrix array run at each APD detector layer, in the gaps between the pixels 1810a and 1810b, where the gaps are on the order of about 1-3 microns.

The nano-plasmonic structures described here may be fabricated using techniques including e-beam lithography to define the nano-particles' positions and shapes in photoresist. The nano-particles may then be thermally evaporated into the lithographically defined regions, followed by overcoating with Si or ITO (indium tin oxide), as appropriate.

The nano-plasmonic structures described here provide a number of advantages. Such structures provide ultra-low k values so critical to very high photo-level detection performance, even at room temperature. This is because of the natural unipolar nature of the electrical properties of the detector when employing nano-plasmonics together with a Schottky barrier. Such ultra-low-noise performance is very valuable in imaging devices and systems, and offers more than 10× performance beyond noisy InGaAs detectors currently used.

The predicted NIR-SWIR Responsivity, as well as out to 3 microns EMR wavelength, is very high, well beyond InGaAs capabilities. Further, the absence of the need for cooling the detectors to achieve near ideal D* photo-voltaic performance allows for a device with very low weight and power consumption. These features make the nano-plasmonic APD devices described an attractive new detector style for applications in the lowest light level environments, such as heavily overcast starlight at night.

The invention claimed is:

1. An avalanche photodiode (APD) electro-magnetic radiation (EMR) detector, comprising:
an EMR absorption region comprising a substantially regular array of nano-particles embedded in a matrix material;
a voltage biasing element configured to apply a bias voltage to the matrix material such that electrical current is directly generated in the EMR absorption region based on a cooperative plasmon effect in the EMR absorption region when electro-magnetic radiation in a predetermined wavelength range is incident upon the EMR absorption region, where the dominant mechanism for decay in the cooperative plasmon effect is non-radiative; and
a charge multiplication region arranged relative to the EMR absorption region to avalanche multiply the electrical current generated in the EMR absorption region,
where the array comprises a plurality of detector elements, each detector element comprising respective groups of nano-particles.

2. The detector of claim 1, having an ionization rate ratio of about 0.0004 or less.

3. The detector of claim 1, wherein the nano-particles comprise metal, semiconductor, or doped oxide material.

4. The detector of claim 1, wherein the predetermined wavelength range includes one or more ranges inclusively between the deep ultraviolet and long wave infrared regions.

5. The detector of claim 1, wherein matrix material comprises a conductive contact material having ohmic or Schottky barrier properties with respect to the embedded nano-particles.

6. The detector of claim 1, wherein the nano-particles comprise semiconductor material, and the matrix material comprises a conductive contact material having ohmic or Schottky barrier properties with respect to the embedded nano-particles.

7. The detector of claim 1, wherein the nano-particles comprise at least one of a metal, a semiconductor, a doped oxide, or graphene, and the matrix material comprises at least one of a Group IV, a Group II-VI, or a Group III-V semiconductor material.

8. The detector of claim 7, wherein the nano-particles comprise gold.

9. The detector of claim 1, wherein each group of nano-particles is arranged to optimally detect EMR in a different wavelength range.

10. The detector of claim 9, wherein the detector elements are vertically spaced with respect to each other.

11. The detector of claim 9, wherein the detector elements are horizontally spaced with respect to each other.

12. The detector of claim 9, wherein the different wavelength ranges include ranges inclusively between the deep ultraviolet and Terahertz regions.

13. The detector of claim 9, wherein one of the detector elements is arranged to optimally detect EMR in the long wave infrared region, the one of the detector elements being sandwiched between a vacuum or aerogel layer.

14. The detector of claim 1, wherein each group of nano-particles is arranged to optimally detect EMR with a different polarization direction.

15. The detector of claim 9, wherein each group of nano-particles is arranged to optimally detect EMR with a different polarization direction.

16. The detector of claim 1, wherein the matrix material comprises a heterojunction, and the nano-particles are embedded in or adjacent to the heterojunction.

17. The detector of claim 1, wherein the voltage biasing element comprises a first electrode on a first side of the matrix material and a second electrode on a second side of the matrix material, the nano-particles arranged between the first and second matrix material.

18. The detector of claim 1, where the EMR absorption region comprises one of a p-n region, a p-i-n region, or a π-region.

19. The detector of claim 1, wherein the detector is a solar cell.

20. The detector of claim 1, wherein the detector is a focal plane array.

21. The detector of claim 1, wherein the shape of the nano-particles is one of cylindrical, spherical, cubic, rectangular-cubic, ellipsoidal, planar, near-planar or spiral-twisted.

22. The detector of claim 1, wherein the nano-particle sizes are in the region between a characteristic dimension of 0.1 nm to 2000 nm.

* * * * *